(12) United States Patent
McLeod

(10) Patent No.: US 8,299,576 B2
(45) Date of Patent: Oct. 30, 2012

(54) CIRCUIT WITH HIGH-DENSITY CAPACITORS USING BOOTSTRAPPED NON-METAL LAYER

(75) Inventor: Scott C. McLeod, Oro Valley, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 13/303,381

(22) Filed: Nov. 23, 2011

(65) Prior Publication Data
US 2012/0092069 A1    Apr. 19, 2012

Related U.S. Application Data

(62) Division of application No. 11/384,961, filed on Mar. 20, 2006, now Pat. No. 8,076,752.

(51) Int. Cl.
*H01L 29/00* (2006.01)
(52) U.S. Cl. ............... 257/532; 257/307; 257/E29.343
(58) Field of Classification Search ............. 257/306, 257/307, 528, 532, E29.343, E29.345
See application file for complete search history.

(56) References Cited

U.S. PATENT DOCUMENTS

| | | | |
|---|---|---|---|
| 5,208,725 A | 5/1993 | Akcasu | |
| 5,387,882 A | 2/1995 | Schoofs | |
| 5,891,783 A | 4/1999 | Lin et al. | |
| 6,124,176 A | 9/2000 | Togo | |
| 6,545,854 B2 | 4/2003 | Trinh et al. | |
| 6,597,562 B1 | 7/2003 | Hu et al. | |
| 6,661,638 B2 | 12/2003 | Jackson et al. | |
| 6,737,698 B1 | 5/2004 | Paul et al. | |
| 6,781,817 B2 | 8/2004 | Andelman | |
| 2005/0145987 A1* | 7/2005 | Okuda et al. | 257/532 |
| 2005/0189614 A1* | 9/2005 | Ihme et al. | 257/532 |
| 2008/0099880 A1* | 5/2008 | Cho et al. | 257/532 |

* cited by examiner

*Primary Examiner* — Matthew E Warren
(74) *Attorney, Agent, or Firm* — Meyertons Hood Kivlin Kower & Goetzel, P.C.; Jeffrey C. Hood

(57) ABSTRACT

A switched-capacitor circuit on a semiconductor device may include accurately matched, high-density metal-to-metal capacitors, using top-plate-to-bottom-plate fringe-capacitance for obtaining the desired capacitance values. A polysilicon plate may be inserted below the bottom metal layer, and bootstrapped to the top plate of each capacitor in order to minimize and/or eliminate the parasitic top-plate-to-substrate capacitance. This may free up the bottom metal layer to be used in forming additional fringe-capacitance, thereby increasing capacitance density. By forming each capacitance solely based on fringe-capacitance from the top plate to the bottom plate, no parallel-plate-capacitance is used, which may reduce capacitor mismatch. Parasitic bottom plate capacitance to the substrate may also be eliminated, with only a small capacitance to the bootstrapped polysilicon plate remaining. The capacitors may be bootstrapped by coupling the top plate of each capacitor to a respective one of the differential inputs of an amplifier comprised in the switched-capacitor circuit.

13 Claims, 3 Drawing Sheets

CIRCUIT WITH HIGH-DENSITY CAPACITORS USING BOOTSTRAPPED NON-METAL LAYER

PRIORITY CLAIM

This application is a divisional application of U.S. patent application Ser. No. 11/384,961 titled "Fringe Capacitor Using Bootstrapped Non-Metal Layer" filed Mar. 20, 2006, now U.S. Pat. No. 8,076,752 whose inventor was Scott C. McLeod, and which is hereby incorporated by reference in its entirety as though fully and completely set forth herein.

BACKGROUND OF THE INVENTION

1. Field of the Invention

This invention relates generally to the field of semiconductor circuit design, and more particularly to the design of a capacitor structure on a semiconductor substrate.

2. Description of the Related Art

Many integrated circuits (ICs), including mixed-signal circuits that include both digital and analog components, oftentimes require high-performance capacitors configured on the chip. Currently, a wide variety of applications—for example dynamic random access memories, phase-locked loops, voltage controlled oscillators, operational amplifiers, and switched capacitor circuits—feature capacitors formed on integrated circuits. Generally, these on-chip capacitors can also be used to decouple digital and analog integrated circuits from potential noise that may be generated by the rest of the system. In many of the present systems, on-chip capacitors are designed as metal-to-metal capacitors due to the advantages such capacitors typically have over other types of capacitors, for example over capacitors formed from gate oxide. For example, in order to avoid costs associated with a metal-insulator-metal capacitor—such as additional masks and additional wafer processing costs—, it is generally desired to form a capacitor using the multiple layers of routing metal available in any given process.

Metal-to-metal capacitor structures are typically stable, predictable, and provide high-capacitance and low on-chip leakage. Metal-to-metal capacitors also provide better linearity than gate-oxide capacitors, and the quality factor of metal-to-metal capacitors is generally independent of the DC voltage of the capacitor. Such structures, however, oftentimes consume a large area of the IC. In order to reduce the required area, capacitors are many times fabricated as parallel-plate capacitor structures using two or more layers of routing metal in the IC. Accordingly, the capacitors are often designed using multiple layers of stacked, alternately connected metal, which form the opposing electrical nodes of the capacitor.

However, in small geometry processes, the fringe-capacitance between metal lines within the same metal layer can be large, and offers an alternate method for constructing metal-to-metal capacitors. It is generally possible to control the spacing between the metal lines within the same metal layer through accurate lithography. In contrast, the capacitance between the various metal layers may not be as effectively controlled, since the thickness of the field-oxide region in the corresponding metal-'field-oxide'-metal structure can generally vary from lot to lot and across a die/wafer. Thus, using the fringe-capacitance between metal lines within the same metal layer to construct metal-to-metal capacitors offers notable advantages.

For example, in switched capacitor circuits, it has generally been desirable to design a well matched capacitor in order to obtain high accuracy. Typically, the goal has been to maximize capacitive density in order to minimize the die area occupied by the capacitor, and to minimize the 'top-plate'-to-substrate capacitance in order to avoid electric charge being drained from critical nodes of the system through parasitic capacitance. In other words, it is oftentimes desirable to create very accurately matched, high capacitance density capacitors without paying the additional cost of parallel-plate capacitors that may be available in a given fabrication process. A minimal 'top-plate'-to-substrate capacitance is preferable because such a capacitance can be a source of errors in switched capacitor circuits. In most current fringe-capacitance solutions, the top plate is shielded using the metal layer closest to the substrate (or bottom metal layer), hence eliminating the 'top-plate'-to-substrate capacitance. This, however, reduces the capacitance density of the fringe-capacitance, since the bottom metal layer cannot be used when forming the desired fringe-capacitance.

Many other problems and disadvantages of the prior art will become apparent to one skilled in the art after comparing such prior art with the present invention as described herein.

SUMMARY OF THE INVENTION

In one set of embodiments, accurate high density capacitors may be constructed on an integrated circuit by using only fringe-capacitance developed between metal lines within a given metal layer and minimizing or completely eliminating parallel-plate-capacitance. In order to maximize fringe-capacitance, the metal lines comprising the top and bottom plates of the capacitor may be interdigitated with minimum spacing, and parallel-plate-capacitance may be minimized or eliminated by stacking top plate traces on top of each other and bottom plate traces on top of each other. Therefore, a top level layer in a multi-layer process may be used for routing, and all layers below the top level layer, including the bottom layer, may be configured as interdigitated structures to maximize capacitance density. In order to minimize capacitance developed between the top plate in the bottom metal layer and the substrate, a low-impedance conductive plate constructed in polysilicon layer may be inserted between the bottom metal layer and the substrate. In one embodiment, the polysilicon plate is bootstrapped to the top plate to drive the polysilicon-to-substrate capacitance and minimize or eliminate any charge transfer from the top plate to the polysilicon plate. Bootstrapping the polysilicon plate to the top plate may also minimize and/or eliminate the bottom-plate-to-substrate capacitance, and all metal layers that are not used for routing may be used in constructing the capacitor(s).

In one embodiment, the bootstrapping of the polysilicon plate to the top plate of the capacitor may be implemented by coupling the top plate of the capacitor to the gate terminal of an NMOS device, and coupling the polysilicon plate to the source terminal of the NMOS device. As a result, the voltage at the polysilicon plate may track the voltage at the top plate, with no considerable voltage change across any parasitic capacitance that may have formed from the top plate of the capacitor to the polysilicon plate. By minimizing or eliminating current flow from the top plate of the capacitor to the polysilicon plate during circuit operation, the parasitic top-plate-to-polysilicon-plate capacitance may effectively be removed from a circuit comprising metal-to-metal capacitors. In one set of embodiments, a switched-capacitor circuit may be configured in an integrated circuit, with the capacitors of the switched-capacitor circuit configured as metal-to-metal capacitors using fringe-capacitance, with a polysilicon plate configured between the bottom metal layer and the substrate.

The top plate of each capacitor of the switched-capacitor circuit may be configured to couple to a corresponding differential input terminal of the differential input stage of an amplifier of the switched-capacitor circuit. The differential input stage may comprise a pair of PMOS devices, which may have their respective source terminals coupled to the gate terminal of an NMOS device, with the source terminal of the NMOS device coupled to the polysilicon plate. The NMOS device may follow the common mode input of the amplifier, and drive the polysilicon plate without affecting the performance of the amplifier or the capacitance at the top plate of each capacitor.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
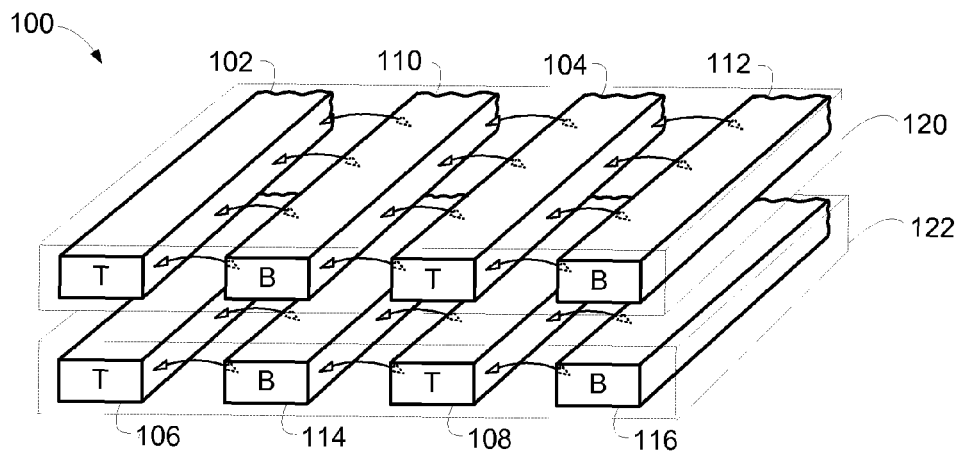
FIG. 1 is a diagram illustrating the electric fields between top capacitor plates and bottom capacitor plates for one embodiment of a metal-to-metal capacitor structure, showing two metal layers.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

When using only fringe-capacitance between metal lines within a given metal layer in constructing metal-to-metal capacitors on an integrated circuit (IC), the ability for matching of unit capacitors may be superior to the matching of unit capacitors whose configuration also includes parallel-plate-capacitance. Likewise, higher capacitive densities may be achieved with capacitors configured using solely fringe-capacitance than with capacitors that also comprise parallel-plate structures. In order to maximize fringe-capacitance, the metal lines or strips used for top and bottom plates of the capacitor may be interdigitated with minimum spacing. Furthermore, by stacking top plate traces on top of each other and bottom plate traces on top of each other, the parallel—or layer to layer—capacitance may be minimized. Thus, a top level layer in a multi-layer process may be used for routing, and all layers below the top level layer, including the bottom layer, may be configured as interdigitated structures to maximize capacitance density.

Turning now to FIG. 1, one example of the interdigitated structure of top and bottom plates for a metal-to-metal capacitor 100 using fringe-capacitance is shown. More specifically, the capacitance is illustrated by the electric field lines from top capacitor plates 102-108 to bottom capacitor plates 110-116, respectively. Parallel plate capacitance may be minimized and/or eliminated by stacking top plates 102 and 106, 104 and 108, and bottom plates 110 and 114, 112 and 116 on top of each other, respectively. By way of example, two metal layers, a first metal layer 120 and a second metal layer 122, are shown in FIG. 1. Those skilled in the art will appreciate that depending on the fabrication technology, more than two metal layers may be available for constructing metal-to-metal capacitors, and while for the sake of simplicity additional metal layers are not shown, the use of additional metal layers is possible and is contemplated. Note also that capacitor 100 may comprise more (or less) than the four metal lines per layer shown, and that the structure of any integrated circuit comprising capacitor structure 100 may extend beyond what is shown in FIG. 1, and such integrated circuit may also comprise components (not shown) in addition to capacitor 100. However, for the sake of simplicity, only the structure of capacitor 100 is shown in FIG. 1 (as well as in subsequent FIGS. 2-3.) Each plate shown in FIG. 1 may represent a metal trace or strip within the respective metal layer in which it is configured. As shown, top plates 102-104 and bottom plates 110-112 may be metal strips in metal layer 120, and top plates 106-108 and bottom plates 114-116 may be metal strips in metal layer 122. The electric field shown between top and bottom plates 102-108, and 110-116, respectively, may represent the capacitance of a metal-to-metal capacitor formed using metal strips 102-116. Also, in various embodiments of capacitors configured according to principles of the present invention, metal layer 122 may in fact be a bottom metal layer, as will be further discussed below.

Figure 2:
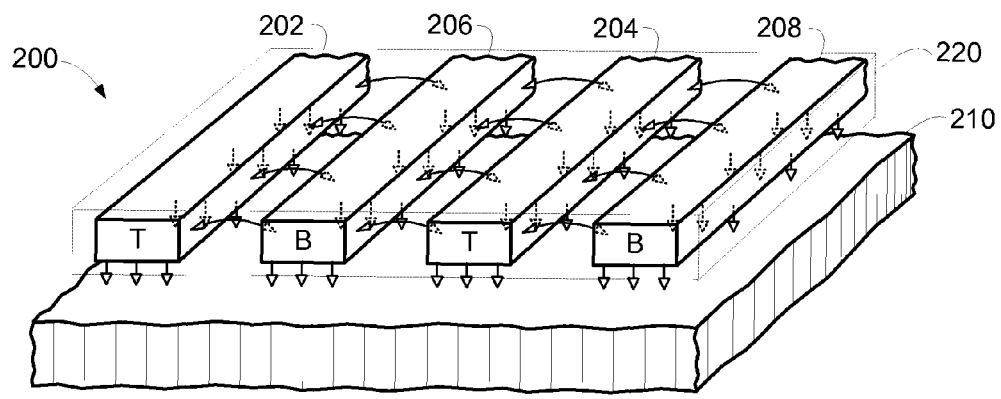
FIG. 2 is a diagram illustrating the electric fields between top capacitor plates and bottom capacitor plates of one embodiment of a metal-to-metal capacitor structure in a bottom metal layer, and the electric fields between the entire bottom metal layer and the substrate.

FIG. 2 shows one example in which metal layer 122 may be a bottom metal layer 220 of a capacitor 200, comprising the interdigitated structure of top capacitor plates 202-204 and bottom capacitor plates 206-208. Note again that the four metal lines within bottom metal layer 220 are shown by way of example, and that capacitor 200 may comprise more than four metal lines or strips within bottom metal layer 220, as well as additional metal layers similarly configured on top of bottom metal layer 220. As seen in FIG. 2, one possible drawback to using bottom metal layer 220 in configuring metal-to-metal capacitors is the capacitance that may develop from top plates 202-204 and bottom plates 206-208 to substrate 210. The undesirable capacitance is illustrated in FIG. 2 via the electric field lines from top capacitor plates 202-204 and bottom capacitor plates 206-208 to substrate 210. While the capacitance developed between bottom plates 206-208 and substrate 210 may be tolerable, the capacitance developed between top plates 202-204 and substrate 210 may be highly undesirable due to possible charge bleed-off when the voltage on top plates 202-204 is varied.

Figure 3:
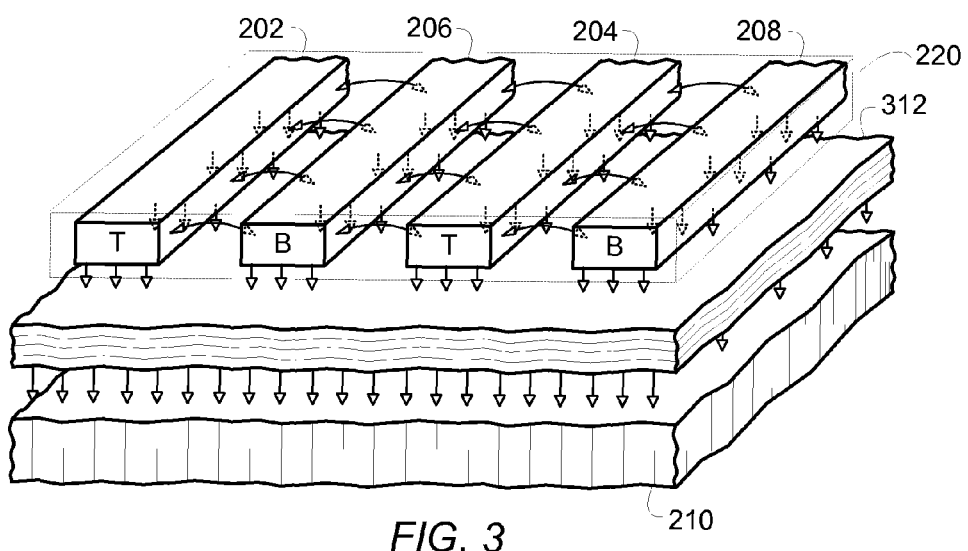
FIG. 3 is a diagram illustrating the electric fields for the metal-to-metal capacitor structure shown in FIG. 2, when a low-impedance polysilicon plate is inserted between the bottom metal layer and the substrate.

In order to minimize the capacitance developed between top plates 202-204 and substrate 210, a low-impedance (finite resistance) conductive plate constructed in a polysilicon layer may be configured between metal layer 220 and substrate 210. This is illustrated in FIG. 3. Polysilicon plate 312 may be inserted between metal layer 220 and substrate 210, and tied to bottom plates 206-208, thereby providing a shield for capacitance developed from top plates 202-204 to substrate 210. In alternate embodiments, polysilicon plate 312 may comprise a number of strips instead of a single plate. The configuration shown in FIG. 3 may however result in a large capacitance from bottom plates 206-208 to substrate 210, and a parallel top-plate-to-bottom-plate capacitance by virtue of bottom plates 206-208 being tied to polysilicon plate 312. This may be undesirable due to possible field-oxide thickness variation over the surface of a wafer and between fabrication lots.

Figure 4:
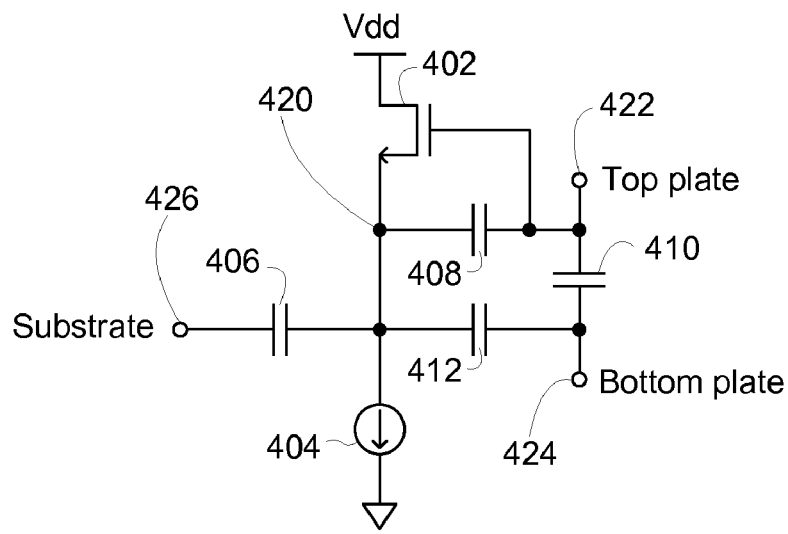
FIG. 4 is a circuit diagram of one embodiment of a bootstrapping configuration for bootstrapping the polysilicon plate inserted between the bottom metal layer and the substrate, to the top capacitor plate.

One possible way to overcome these problems may be to bootstrap polysilicon plate 312 to top plates 202-204, instead of tying polysilicon plate 312 to bottom plates 206-208. FIG. 4 shows one embodiment of a bootstrapping circuit which is configured to couple polysilicon plate 312 to top capacitor plates 202-204, driving the capacitance developed from polysilicon plate 312 to substrate 210, resulting in polysilicon plate 312 moving identically to the voltage level of top plates 202-204. The configuration shown in FIG. 4 may result in eliminating charge transfers that may take place from top plates 202-204 to polysilicon plate 312, and while a capacitance from bottom plates 206-208 to polysilicon plate 312 may exist, the capacitance developed from top plates 202-204 to bottom plates 206-208 may comprise solely fringe-capacitance. Referring back to FIG. 3, in alternate embodiments, polysilicon plate 312 may be replaced with a diffusion layer—for example an n-well diffusion layer—configured within substrate 210, and bootstrapped to top capacitor plates 202-204 in a manner similar to that shown in FIG. 4 for polysilicon plate 312.

As shown in FIG. 4, polysilicon plate 312 is represented by node 420, the top-plate-to-polysilicon capacitance is represented by capacitor 408, the bottom-plate-to-polysilicon capacitance is represented by capacitor 412, the top-plate-to-bottom-plate capacitance is represented by capacitor 410, and the polysilicon-to-substrate capacitance is represented by capacitor 406. Terminal 422 represents top plates 202-204 and terminal 424 represents bottom plates 206-208. Top plate terminal 422 may be coupled to the gate of NMOS device 402, resulting in node 420 tracking terminal 422, and no considerable voltage change across capacitor 408 (i.e. no considerable current flowing from top plate terminal 422 to polysilicon plate node 420). This may effectively remove capacitor 408 from the circuit during circuit operation, which, referring again to FIG. 3, would functionally eliminate the parasitic capacitance from top plates 202-204 to polysilicon 312, though a capacitance between top plates 202-204 and polysilicon 312 may still exist. Since there is no parasitic capacitance from bottom plates 206-208 (terminal 424 in FIG. 4) to substrate 210 (terminal 426 in FIG. 4), all available metal layers, including bottom metal layer 200, may be used to form the desired metal-to-metal capacitors, with only fringe-capacitance forming from top plates 202-204 to bottom plates 206-208, respectively. It should be noted that while the bootstrapping circuit in FIG. 4 is shown being implemented with an NMOS device, use of other devices and/or circuits which may facilitate reducing and/or eliminating charge transfer from top plate node 422 to polysilicon plate node 420 is possible, and is contemplated.

Figure 5:
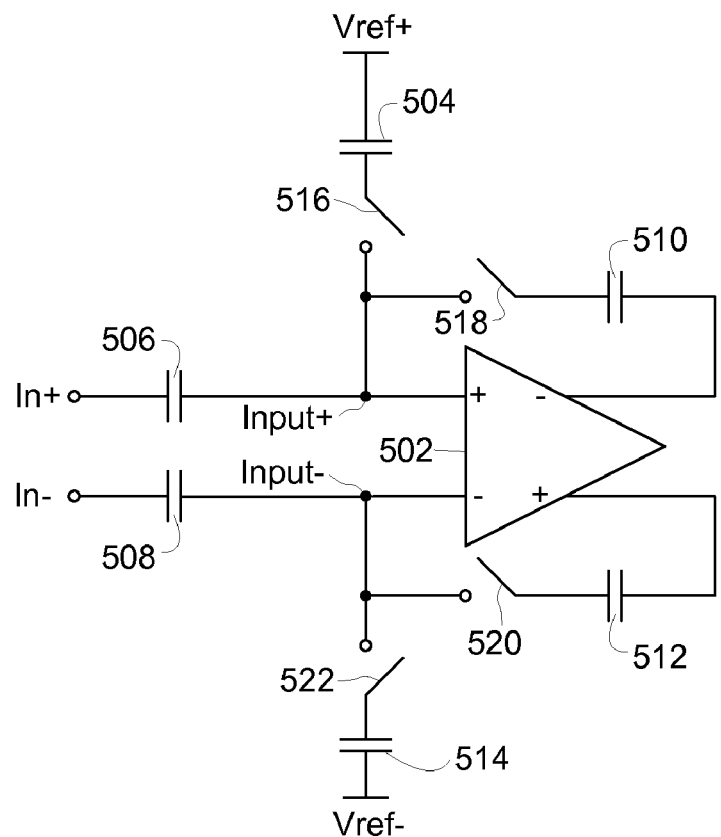
FIG. 5 is one embodiment of a switched-capacitor circuit that can be configured with metal-to-metal capacitors having a polysilicon plate inserted between the bottom metal layer and the substrate, with the polysilicon plate bootstrapped to the top capacitor plates.

FIG. 5 shows one embodiment of a switched capacitor circuit 500 that may be used in a delta-sigma analog to digital converter (ADC). Circuit 500 shown in FIG. 5 may be configured with an amplifier 502—which may be an operational transconductance amplifier—, input capacitors 506 and 508, feedback capacitors 510 and 512, capacitors 504 and 514, and switches 516-522. Capacitors 504-514 may be metal-to-metal capacitors configured on the integrated circuit that comprises switched capacitor circuit 500. Applying the bootstrapping configuration shown in FIG. 4 to the inputs of amplifier 502 for capacitors 504-514 may result in more accurate matching of capacitors 504-514, and consequently in a more accurate switched capacitor circuit 500.

Figure 6:
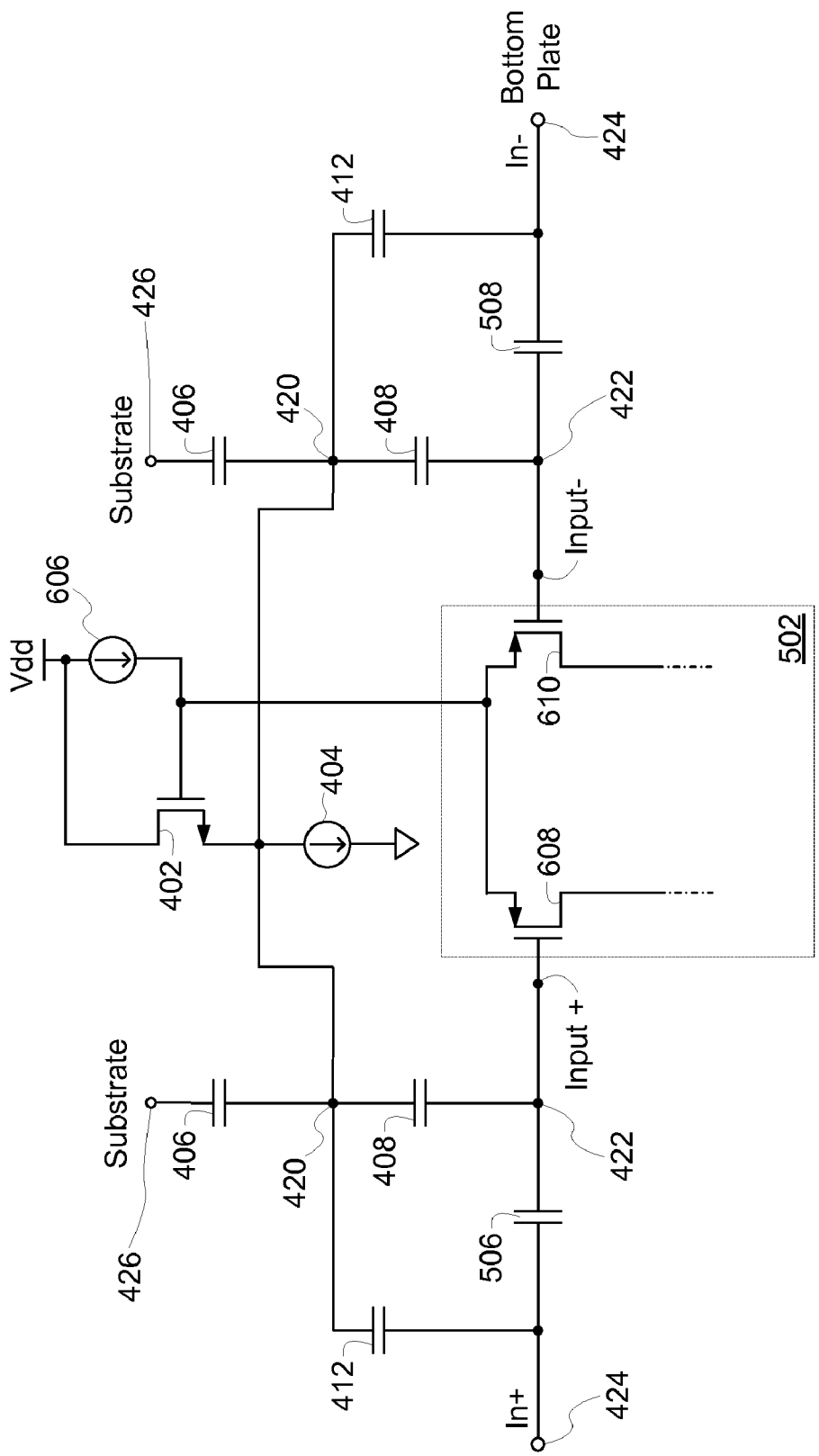
FIG. 6 is a circuit diagram of one embodiment of the bootstrapping configuration of FIG. 4 applied to the input stage of the amplifier comprised in the switched-capacitor circuit of FIG. 5.

FIG. 6 illustrates how capacitors 506 and 508 may be bootstrapped through their respective top plates to differential inputs of amplifier 502, according to the bootstrapping configuration shown in FIG. 4. The top plate of capacitor 506 may be coupled to differential input terminal Input+ of amplifier 502, and the top plate of capacitor 508 may be coupled to differential input terminal Input− of amplifier 502. It should be noted that while capacitors 406, 408 and 412 (shown in FIGS. 4 and 6) represent the various parasitic capacitances as previously described and illustrated in FIGS. 1-3, capacitor 410—that is, the capacitance developed between the top and bottom plates—represents the actual desired capacitance of metal-to-metal capacitors 506 and 508. Hence, capacitors 506 and 508 in FIG. 6 may each represent the structural equivalent of capacitance 410 shown in FIG. 4. In other words, capacitors 506 and 508 may be metal-to-metal capacitors, with the respective value of each capacitor corresponding to capacitance 410 from FIG. 4. The differential input stage of amplifier 502 may comprise PMOS devices 608 and 610, and NMOS device 402 may be configured to follow the common mode input of amplifier 502, driving the polysilicon plate without affecting the performance of amplifier 502, or the capacitance at the top plate. While the bootstrapping configuration is only shown for capacitors 506 and 508, capacitors 504 and 510-514 may also be bootstrapped in a similar manner, with the top plate of each capacitor facing respective input nodes, Input+ or Input−, of amplifier 502. In each instance, the top-plate-to-bottom-plate capacitance (410 in FIG. 4) may correspond to the actual capacitance. For example, the top plate of capacitor 510 may be coupled to switch 518, with switch 518 coupled between top plate 422 and Input+ of amplifier 502.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A switched-capacitor circuit comprising:
   a plurality of capacitors configured on a semiconductor, each capacitor of the plurality of capacitors having a respective top plate and a respective bottom plate, with a respective capacitance developed between the respective top plate and the respective second plate, each capacitor comprising:
      one or more layers of conductive strips forming the capacitor, wherein for each pair of neighboring conductive strips within each of the one or more layers of conductive strips:
         a first conductive strip of the pair of neighboring conductive strips is coupled to the respective top plate of the capacitor and not to the respective bottom plate of the capacitor; and
         a second conductive strip of the pair of neighboring conductive strips is coupled to the respective bottom plate of the capacitor and not to the respective top plate of the capacitor; and
      a low-impedance conductive layer spanning an area underneath all respective one or more layers of conductive strips;
   a differential amplifier comprising an input stage having a first input and a second input, wherein the first input is coupled to the respective top plate of each capacitor of a first subset of the plurality of capacitors, and wherein the second input is coupled to the respective top plate of each capacitor of a second subset of the plurality of capacitors; and
   a first transistor device comprising:
      a control terminal coupled to the input stage of the differential amplifier; and
      a first channel terminal coupled to the low-impedance conductive layer.

2. The switched-capacitor circuit of claim 1, wherein the first transistor device further comprises a second channel terminal coupled to a supply voltage.

3. The switched-capacitor circuit of claim 1, wherein the first channel terminal of the first transistor device is coupled to a current source configured to source a specified current through the first transistor device.

4. The switched-capacitor circuit of claim 1, wherein the first input of the differential amplifier is an inverting input and the second input of the differential amplifier is a non-inverting input.

5. The switched-capacitor circuit of claim 1, wherein the input stage of the differential amplifier comprises a second transistor device and a third transistor device, wherein the first input of the differential amplifier is a control terminal of the second transistor device and the second input of the differential amplifier is a control terminal of the third transistor device;
   wherein a first channel terminal of the second transistor device and a first channel terminal of the third transistor device are each coupled to the control terminal of the first transistor device.

6. The switched-capacitor circuit of claim 5, wherein the differential amplifier is an operational transconductance amplifier, the first transistor device is an NMOS device, and the second and third transistor devices are PMOS devices.

7. The switched-capacitor circuit of claim 1, wherein the one or more layers of conductive strips comprise metal layers.

8. The switched-capacitor circuit of claim 1, wherein the low-impedance conductive layer comprises a polysilicon plate.

9. The switched-capacitor circuit of claim 1, wherein the low-impedance conductive layer comprises one of:
   a solid planar low-impedance conductive material; and
   a plurality of low-impedance conductive strips.

10. The switched-capacitor circuit of claim 1, wherein the low-impedance conductive layer comprises a diffusion layer configured within a substrate of the semiconductor beneath a bottom layer of the one or more layers of conductive strips.

11. The switched-capacitor circuit of claim 10, wherein the diffusion layer comprises one of:
    an n-well diffusion layer; and
    a p-well diffusion layer.

12. The switched-capacitor circuit of claim 1, wherein conductive strips of the one or more layers of conductive strips coupled to the respective top plate of the capacitor are vertically aligned.

13. The switched-capacitor circuit of claim 1, wherein conductive strips of the one or more layers of conductive strips coupled to the respective bottom plate of the capacitor are vertically aligned.

* * * * *

UNITED STATES PATENT AND TRADEMARK OFFICE
CERTIFICATE OF CORRECTION

PATENT NO. : 8,299,576 B2  Page 1 of 1
APPLICATION NO. : 13/303381
DATED : October 30, 2012
INVENTOR(S) : Scott C. McLeod It is certified that error appears in the above-identified patent and that said Letters Patent is hereby corrected as shown below:

Title Page:

Item (74) Attorney, Agent, or Firm:
delete "Kower" and substitute -- Kowert --.

Signed and Sealed this
Fifteenth Day of January, 2013

David J. Kappos
*Director of the United States Patent and Trademark Office*